US008851133B2

(12) United States Patent
Liu et al.

(10) Patent No.: US 8,851,133 B2
(45) Date of Patent: Oct. 7, 2014

(54) METHOD AND APPARATUS OF HOLDING A DEVICE

(75) Inventors: Martin Liu, Yonghe (TW); Chung-Yi Yu, Hsin-Chu (TW); Che Ying Hsu, Tianjhong Township, Changhua County (TW); Yeur-Luen Tu, Taichung (TW); Da-Hsiang Chou, Tainan (TW); Chia-Shiung Tsai, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 525 days.

(21) Appl. No.: 12/414,861

(22) Filed: Mar. 31, 2009

(65) Prior Publication Data

US 2010/0248446 A1 Sep. 30, 2010

(51) Int. Cl.
C23C 16/50 (2006.01)
C23C 16/00 (2006.01)
C23F 1/00 (2006.01)
H01L 21/306 (2006.01)
H01L 21/683 (2006.01)

(52) U.S. Cl.
CPC .................................. *H01L 21/6838* (2013.01)
USPC ....................... 156/358; 118/728; 156/345.51

(58) Field of Classification Search
USPC ......................... 118/728, 729, 730, 731, 732;
156/345.51, 345.52, 345.53, 345.54,
156/345.55, 358
See application file for complete search history.

(56) References Cited

U.S. PATENT DOCUMENTS

| 5,191,218 | A | | 3/1993 | Mori et al. |
| 5,609,720 | A | * | 3/1997 | Lenz et al. ..................... 438/715 |
| 5,631,803 | A | * | 5/1997 | Cameron et al. .............. 361/234 |
| 5,857,667 | A | | 1/1999 | Lee |
| 6,320,736 | B1 | * | 11/2001 | Shamouilian et al. ........ 361/234 |
| 6,399,143 | B1 | * | 6/2002 | Sun et al. ..................... 427/2.14 |
| 6,628,503 | B2 | | 9/2003 | Sogard |
| 6,920,915 | B1 | * | 7/2005 | Shih et al. ........................ 165/47 |
| 2002/0062787 | A1 | * | 5/2002 | Hashizume et al. .......... 118/664 |
| 2004/0036850 | A1 | * | 2/2004 | Tsukamoto et al. ............ 355/72 |
| 2006/0172031 | A1 | * | 8/2006 | Babbs et al. ................... 425/385 |
| 2007/0228589 | A1 | | 10/2007 | Choi et al. |

FOREIGN PATENT DOCUMENTS

JP    2008-87075    4/2008

OTHER PUBLICATIONS

SIPO Patent Office, Office Action dated Mar. 23, 2011, Application No. 200910062400.1, 5 pages.

* cited by examiner

*Primary Examiner* — Rakesh Dhingra
*Assistant Examiner* — Tiffany Nuckols
(74) *Attorney, Agent, or Firm* — Haynes and Boone, LLP

(57) ABSTRACT

Provided is an apparatus and a method of holding a device. The apparatus includes a wafer chuck having first and second holes that extend therethrough, and a pressure control structure that can independently and selectively vary a fluid pressure in each of the first and second holes between pressures above and below an ambient pressure. The method includes providing a wafer chuck having first and second holes that extend therethrough, and independently and selectively varying a fluid pressure in each of the first and second holes between pressures above and below an ambient pressure.

20 Claims, 9 Drawing Sheets

US 8,851,133 B2

METHOD AND APPARATUS OF HOLDING A DEVICE

FIELD OF THE INVENTION

The present disclosure relates generally to a holding apparatus, and more particularly, to a wafer chuck and a pressure control structure.

BACKGROUND

The semiconductor integrated circuit (IC) industry has experienced rapid growth in recent years. Technological advances in IC materials and design have produced generations of ICs where each generation has smaller and more complex circuits than the previous generation. These ICs are usually fabricated by processing a semiconductor wafer. The processing of the semiconductor wafer may require holding the semiconductor wafer with an apparatus such as a wafer chuck. However, current wafer holding apparatuses may cause wafer defects such as stress defects or bubble defects that may render ICs ineffective or unusable. Thus, while existing wafer holding apparatuses have been generally adequate for their intended purposes, they have not been entirely satisfactory in every aspect.

SUMMARY

One of the broader forms of the present disclosure involves an apparatus that includes: a wafer chuck having first and second holes that extend therethrough; and a pressure control structure that can independently and selectively vary a fluid pressure in each of the first and second holes between pressures above and below an ambient pressure.

Another of the broader forms of the present disclosure involves a method of fabricating a semiconductor device that includes: providing a wafer chuck having first and second holes that extend therethrough; and independently and selectively varying a fluid pressure in each of the first and second holes between pressures above and below an ambient pressure.

Still another of the broader forms of the present disclosure involves a method of fabricating a semiconductor device that includes: providing a wafer chuck having a top side and a bottom side, the wafer chuck having first and second holes that extend therethrough; and independently and selectively regulating fluid flow into or out of each of the first and second holes.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
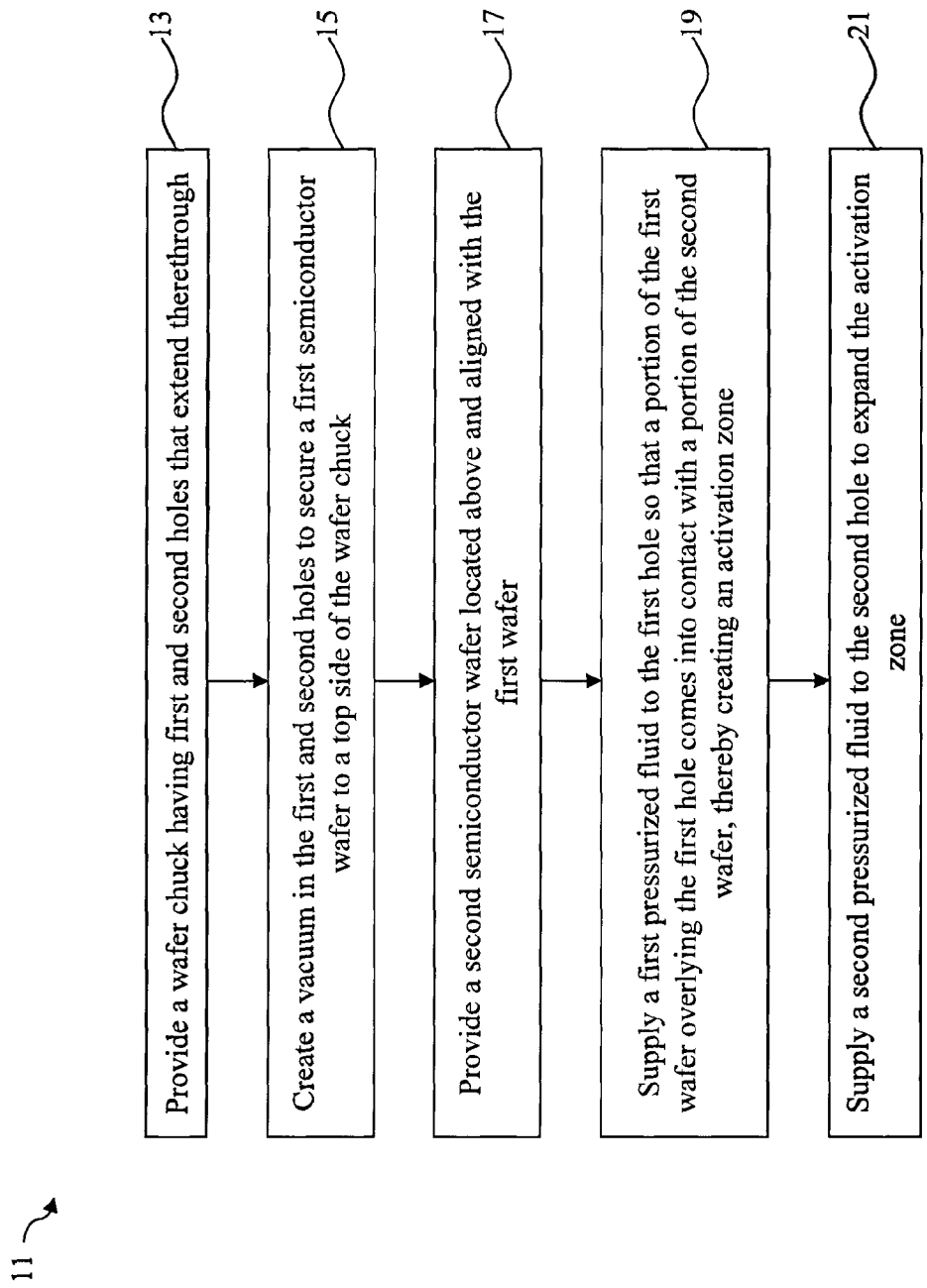
FIG. 1 is a flowchart illustrating a method for fabricating a semiconductor device according to various aspects of the present disclosure.

Illustrated in FIG. 1 is a flowchart of a method 100 for independently and selectively varying a fluid pressure in each of a plurality of holes in a wafer chuck according to various aspects of the present disclosure. Referring to FIG. 1, the method 11 begins with block 13 in which a wafer chuck having first and second holes that extend therethrough is provided. The method 11 continues with block 15 in which a vacuum in the first and second holes is created to secure a first semiconductor wafer to a top side of the wafer chuck. The method 11 continues with block 17 in which a second semiconductor wafer located above and aligned with the first wafer is provided. The method 11 continues with block 19 in which a first pressurized fluid is supplied to the first hole so that a portion of the first wafer overlying the first hole comes into contact with a portion of the second wafer, thereby creating an activation zone. The method 11 continues with block 21 in which a second pressurized fluid is supplied to the second hole to expand the activation zone.

Figure 2:
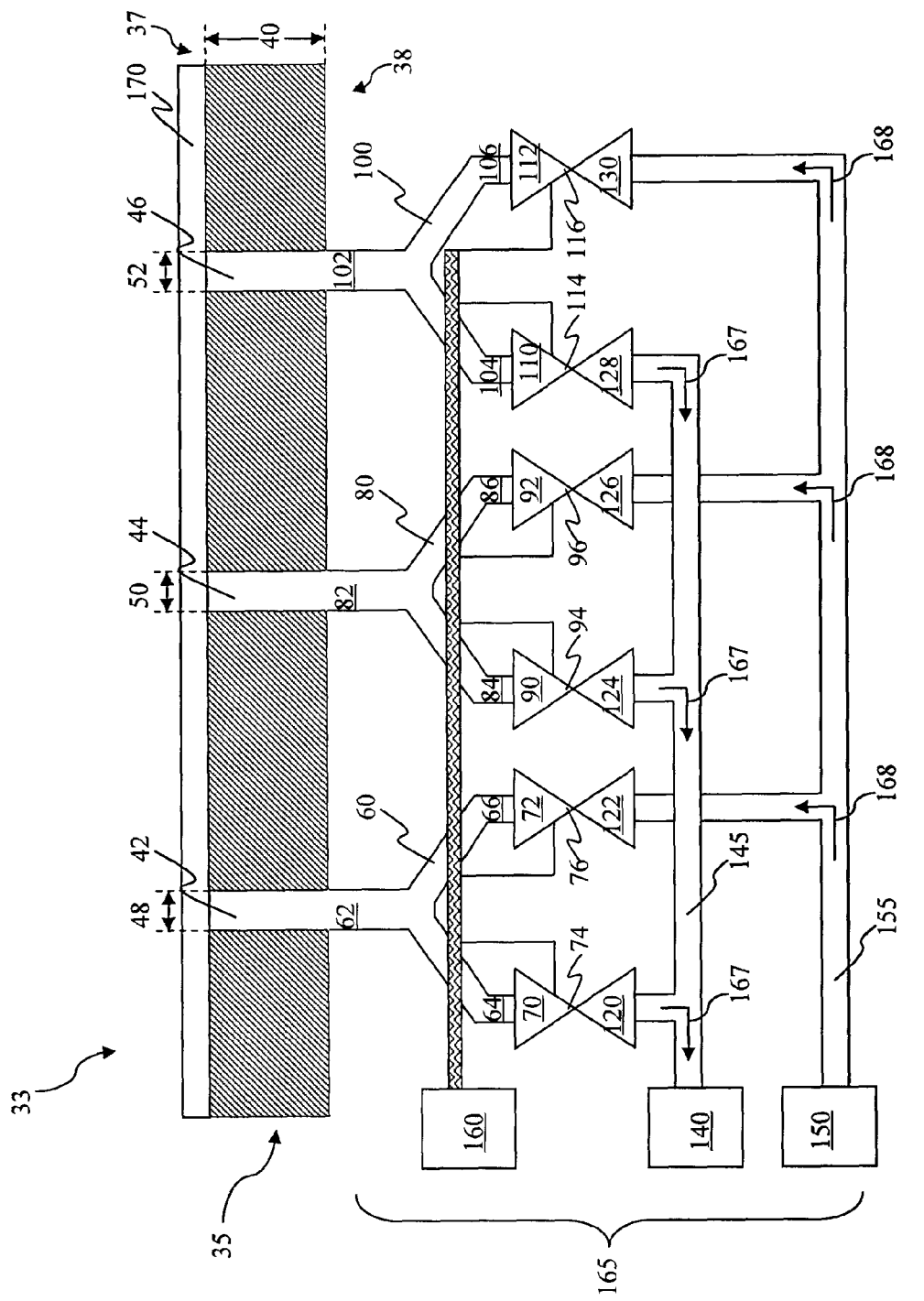
FIG. 2 is a high level diagrammatic view of a device holding apparatus according to various aspects of the present disclosure.
Figure 3B:
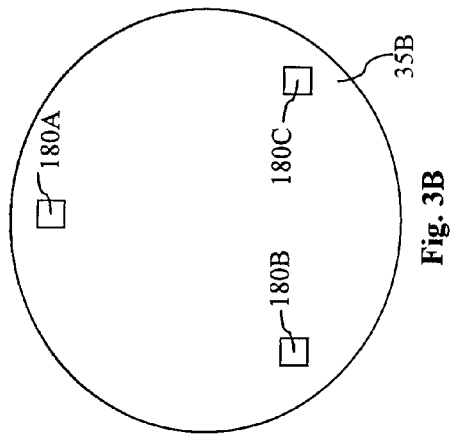
FIGS. 3-5 are diagrammatic top level views of various embodiments of a wafer chuck that is a part of the device holding apparatus according to various aspects of the present disclosure.
Figure 3D:
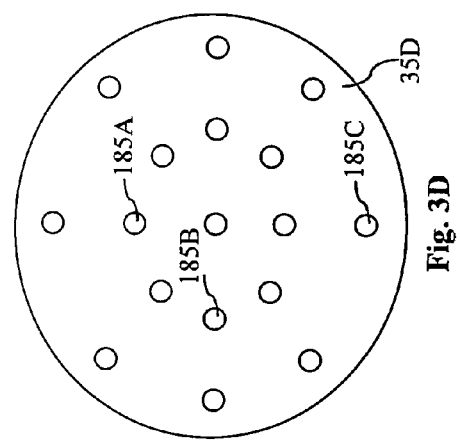
Figure 3A:
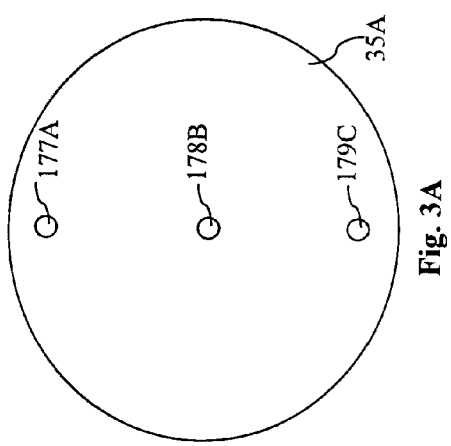
Figure 3C:
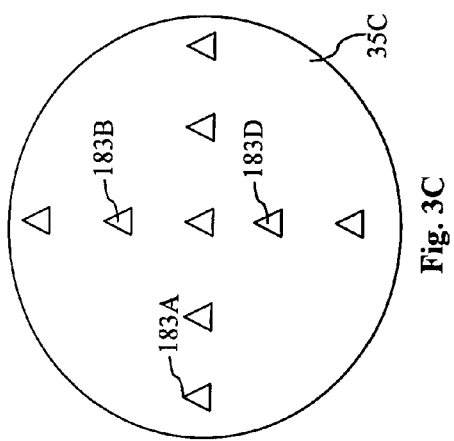

Referring to FIG. 2, a high level diagrammatic view of a device holding apparatus 33 is illustrated. The device holding apparatus 33 includes a wafer chuck 35 that includes a nonconductive material, such as a ceramic material. The wafer chuck 35 has a top surface (also referred to as top side) 37 and a bottom surface (also referred to as bottom side) 38. The top surface 37 and bottom surface 38 are both relatively flat, such that a thickness 40 of the wafer chuck 35 varies within a range from about 0.1 microns (um) to about 100 um, for example, about 5 um. The amount of variation of the thickness 40 of the wafer chuck 35 may also be referred to as a total thickness variation. The wafer chuck 35 also includes one or more holes (or openings). For the sake of simplicity and illustration, three of the holes 42, 44, and 46 are shown in FIG. 2. The holes 42, 44, 46 extend through the wafer chuck 35. The holes 42, 44, and 46 have sizes 48, 50, and 52, respectively. In the embodiment shown in FIG. 2, the sizes 48, 50, and 52 are in a range from about 0.1 mili-meter (mm) to about 50 mm, for example, about 0.5 mm. It is understood that the values provided above are merely exemplary, and alternative values may be used to implement the embodiment shown in FIG. 2 without departing from the spirit and scope of the present disclosure.

The hole 42 is coupled to a passageway 60 through a port 62 of the passageway 60. The passageway 60 also includes ports 64 and 66 that are coupled to top end portions 70 and 72 of valves 74 and 76, respectively. The hole 44 is coupled to a passageway 80 through a port 82 of the passageway 80. The passageway 80 also includes ports 84 and 86 that are coupled to top end portions 90 and 92 of valves 94 and 96, respectively. The hole 46 is coupled to a passageway 100 through a port 102 of the passageway 100. The passageway 100 also includes ports 104 and 106 that are coupled to top end portions 110 and 112 of valves 114 and 116, respectively. Each of the valves 74, 76, 94, 96, 114, and 116 also has bottom end portions 120, 122, 124, 126, 128, and 130, respectively. The bottom end portions 120, 124, and 128 are coupled to a vacuum source, such as a vacuum pump 140 through a passageway 145. The bottom end portions 122, 126, and 130 are coupled to a pressure source, such as a pressure pump 150 through a passageway 155. The passageways 60, 80, 100, each includes hoses, pipes, conduits, or combinations thereof, to allow a fluid, such as air, to flow into or out of the respective holes 42, 44, and 46. The passageways 145 and 155 are similar to the passageways 60, 80, and 100, so that a fluid can flow into or out of the vacuum pump 140 and the pressure pump 150, respectively. The valves 74, 76, 94, 96, 114, and 116 can each be opened to allow free fluid flow therethrough, or closed so that there is no fluid therethrough. The valves 74, 76, 94, 96, 114, and 116 are coupled to a controller 160, such that the controller 160 can independently and selectively control the opening and closing of each of the valves 74, 76, 94, 96, 114, and 116. The controller 160 may be an operator, such as a technician or an engineer, a computer running preloaded programs, or another device suitable for automation.

The combination of the passageways 60, 80, 100, 145, and 155, the valves 74, 76, 94, 96, 114, 116, the vacuum pump 140, the pressure pump 150, and the controller 160 may each be considered as a component of a pressure control structure 165. The various components in the pressure control structure 165 work in conjunction with one another to regulate fluid flow between the holes 42, 44, 46 and the vacuum pump 140 and the pressure pump 150. For example, the vacuum pump 140 can be used to create a suction force so that a fluid 167 flows toward the vacuum source 140. In other words, the vacuum pump 140 is supplying a vacuum. The pressure pump 150 can be used to create a pressure so that a fluid 168 flows away from the pressure pump 150. In other words, the pressure pump 150 is supplying a pressurized fluid 168. The fluids 167 and 168 include air. Alternatively, the fluids 167 and 168 may include another suitable gas or liquid. The fluids 167 and 168 may be the same or different.

The controller 160 is used to select a flow route of the fluids 167 and 168. In one embodiment, the controller 160 opens valves 74, 96, and 114 and closes valves 76, 94, and 116. Thus, the fluid 167 is forced to flow out of the hole 42, through the passageway 60, through the open valve 74, and through the passageway 145 toward the vacuum pump 140. Since the valve 76 is closed, the pressurized fluid supplied by the pressure pump 150 cannot pass through the valve 76 and thus does not reach the hole 42. Similarly, a fluid is forced to flow out of the hole 46 toward the vacuum pump 140, while the pressurized fluid supplied by the pressure pump 150 is cut off by the valve 116. With respect to the hole 44, the vacuum pump 140 does not force fluid to flow out of the hole 44 and toward the vacuum pump 140, since the valve 94 is closed. However, since the valve 96 is open, the pressure pump 150 is able to supply the pressurized fluid to the hole 44 through the passageways 155 and 80. The specific flow route discussed above is merely exemplary, and other flow routes may be designed by using the controller to open and close the valves 74, 76, 94, 96, 114, and 116.

Continuing with the above example, each of the holes 42, 44, and 46 has an original pressure therein, which may be referred to as an ambient pressure. In the present embodiment, the ambient pressure is a standard atmosphere pressure, which is approximately equal to 1013.25 mili-bars. As discussed above, flowing the fluid 167 out of the holes 42 and 46 reduces the ambient pressures inside the holes 42 and 46, respectively. The reduced pressures in the holes 42 and 46 causes a vacuum effect inside the holes 42 and 46, which results in a suction force that pulls a device such as a semiconductor wafer 170 located over the top side 37 of the wafer chuck 35 in a downward direction. In the present embodiment, the suction force in each of the holes 42 and 46 is about 940 mili-bars. In other words, the ambient pressure inside the holes 42 and 46 is reduced by about 940 mili-bars by flowing the fluid 167 out of the holes 42 and 46. Consequently, the semiconductor wafer 170 may be secured to the wafer chuck 35. Meanwhile, delivering the pressurized fluid 168 to the hole 44 increases the ambient pressure inside the hole 44. In the present embodiment, the ambient pressure inside the hole 44 is increased by about 940 mili-bars. The pressure increase in the hole 44 may cause a portion of the wafer 170 overlying the hole 44 to bend upwards (not illustrated). Thus, the pressure control structure 165 can independently and selectively vary the fluid pressure in each of the holes 42, 44, and 46 between pressures above and below the ambient pressure. It may also be said that the vacuum pump 140 and the pressure pump 150 are each in fluid communication with the holes 42, 44, and 46.

Referring now to FIG. 3, diagrammatic top level views of several exemplary embodiments of the wafer chuck 35 are shown. In FIG. 3A, one embodiment of the wafer chuck 35A has a substantially circular shape and includes substantially circular holes 177A, 178B, and 179C. The holes 177A, 177B, and 177C together form a pattern resembling a straight line. The holes 177A and 177C are located near an edge region of the wafer chuck 35A, and the hole 177B is located near a center region of the wafer chuck 35A. In FIG. 3B, a different embodiment of the wafer chuck 35B has a substantially circular shape and includes substantially rectangular holes 180A, 180B, and 180C. The holes 180A, 180B, and 180C together form a pattern resembling a triangle. The holes 180A, 180B, and 180C are located near an edge region of the wafer chuck 35B and are located about radially equi-distant from a center region of the wafer chuck 35B. In FIG. 3C, another embodiment of the wafer chuck 35C has a substantially circular shape and includes substantially triangular holes 183. The holes 183 together form a pattern resembling two lines crossing each other, such as a "+" sign. One of the holes 183 is located near a center region of the chuck 35C, and the other holes 183 extend from the center region of the wafer chuck 35C in upward, downward, left, and right directions. In FIG. 3D, a further embodiment of the wafer chuck 35D has a substantially circular shape and includes substantially circular holes 185. One of the holes 185 is located near a center region of the wafer chuck 35D, and the other holes 185 radially extend from the center region of the wafer chuck in a plurality of directions. It is understood that although the wafer chucks 35A-35D shown in FIG. 3 all have substantially circular shapes, other embodiments of the wafer chuck 35 may take on other shapes, such as a rectangular, oval, trapezoidal, triangular, or a polygonal shape that is suitable for holding a desired device. Further, although the holes 177-185 in the embodiments shown in FIG. 3 have substantially circular, rectangular, or triangular shapes, they may take on other suitable shapes in alternative embodiments. Using the wafer chucks illustrated in FIG. 3 and discussed above during semiconductor fabrication may reduce edge stress defects and bubble defects in the semiconductor wafers, in comparison with semiconductors fabricating using existing chucks.

Figure 4:
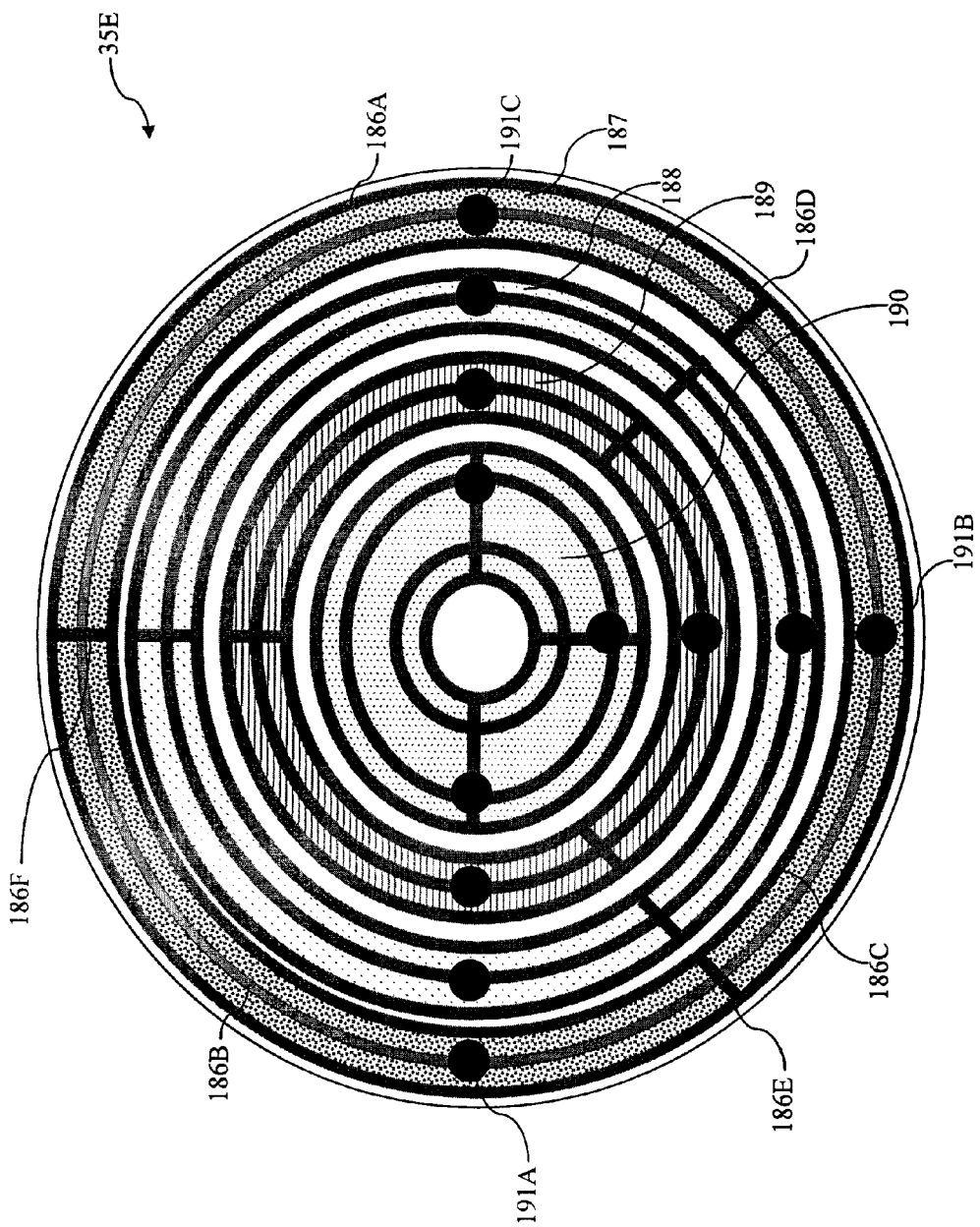

Referring now to FIG. 4, a diagrammatic top level view of another embodiment of a wafer chuck 35E is illustrated. The wafer chuck 35E includes a plurality of grooves 186, for example, 186A, 186B, and 186C. The grooves 186 are shown as dark circular regions and dark rectangular regions interconnecting the circular regions in FIG. 4. The interconnection of these grooves 186 form four pressure zones 187, 188, 189 and 190, which take on concentric circular shapes in the embodiment shown in FIG. 4. For example, pressure zone 187 includes circular grooves 186A, 186B, 186C and rectangular grooves 186D, 186E, 186F, where the circular grooves 186A-186C are interconnected to one another by rectangular grooves 186D-186F. In the embodiment shown in FIG. 4, pressure zone 190 is the closest to a center region of the wafer chuck 35E, followed by pressure zones 189, 188, and 187, respectively.

Each of the pressure zones 187-190 also includes one or more holes 191 that are coupled to a pressure control structure (not illustrated) similar to the pressure control structure 165 described above in FIG. 2. For example, holes 191A, 191B, and 191C are located on groove 186B in pressure zone 187. The pressure control structure is used to vary an ambient pressure in each of the holes 191 by creating a vacuum inside the holes 191 or supplying a pressurized fluid to the holes 191 in accordance with the discussions for FIG. 2 above. Since the holes 191 are located on the grooves 186, pressure in the grooves 186 respond to the changes in pressure in the holes 191 accordingly. For example, if a vacuum is created in the hole 191B, a vacuum is created in the grooves 186A-186C as well, since the grooves 186A-186C are connected to the hole 191B. The holes 191 are coupled to the pressure control structure in a way that the pressure control structure can individually control the pressure in each of the holes 191, and therefore the pressure in each of the pressure zones 187-190. For example, a vacuum may be created in pressure zones 187 and 189 to lower the pressures in the pressure zones 187 and 189, while a pressurized fluid is supplied to the pressure zones 188 and 190 to increase the pressures in the pressure zones 188 and 190.

Figure 5:
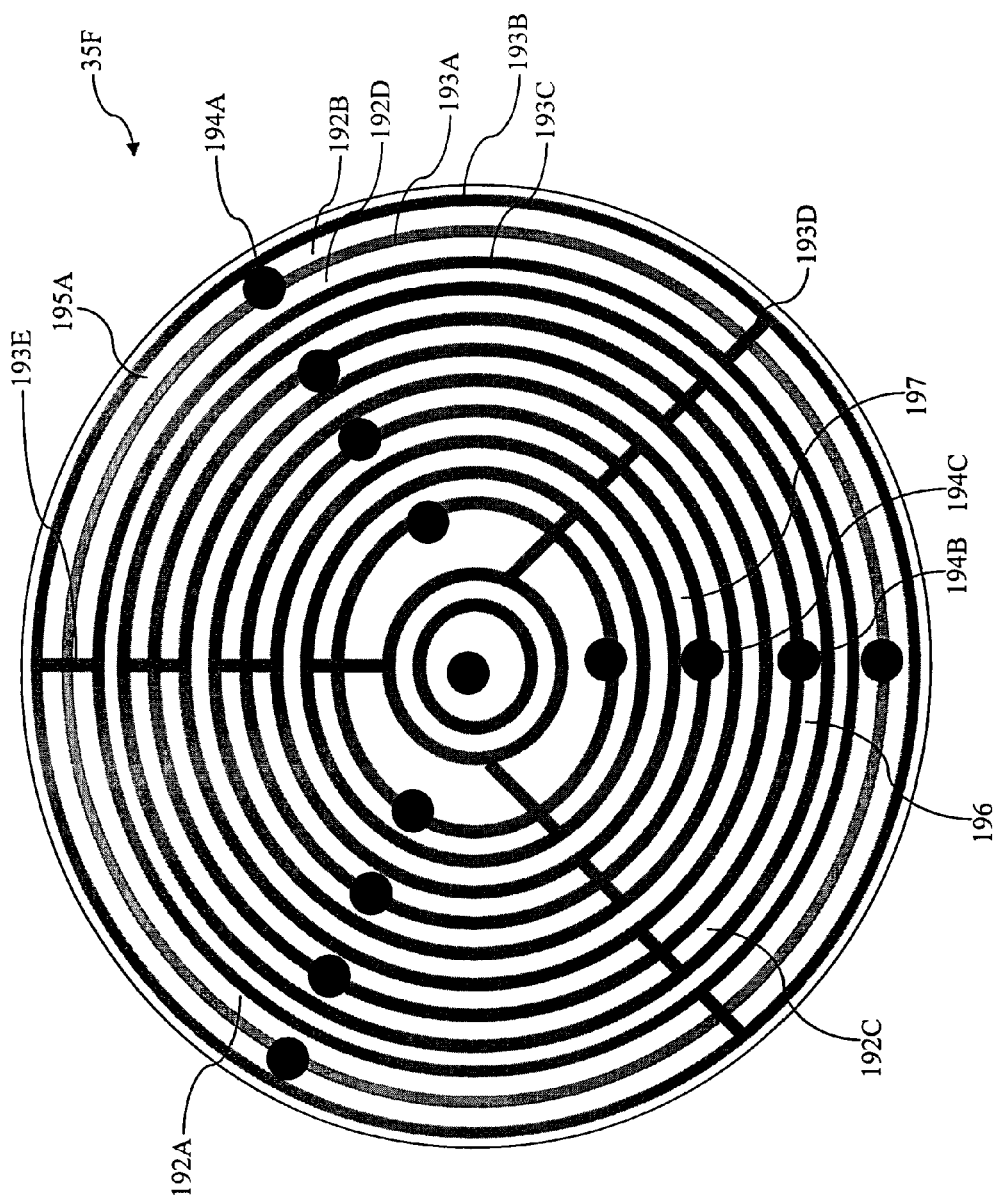

Referring now to FIG. 5, a diagrammatic top level view of yet another embodiment of a wafer chuck 35F is illustrated. The wafer chuck 35F includes a plurality of grooves 192, for example, 192A, 192B, 192C, and 192D. The grooves 192 are shown as light circular regions that are surrounded by dark regions 193 in FIG. 5. The dark circular regions 193 are "walls" that separate the grooves 192 from one another. For example, grooves 192B and 192D are separated from each other by wall 193A and surrounded by walls 193B, 193C, 193D, and 193E. A hole 194A is drilled through the wall 193A and spreads into the grooves 192B and 192D. Thus, the hole 194A is interconnected with the grooves 192B and 192D. The hole 194A is also coupled to a pressure control structure (not illustrated) similar to the pressure control structure 165 described above in FIG. 2. Hence, the pressure control structure can vary an ambient pressure inside the grooves 192B and 192D by varying the pressure inside the hole 194A. As such, the grooves 192B,192D and the hole 194A form a pressure sector 195, which takes on a shape resembling a 120 degree arc in a circle. Similarly, other holes, such as holes 194B and 194C are used in conjunction with other grooves to form more pressure sectors, such as pressure sectors 196 and 197. The pressure in each of the pressure sectors 195-197 can be individually controlled by the pressure control structure coupled to the respective holes 194 of each pressure sector 195-197. For example, a vacuum may be created in pressure sectors 195 and 197 to lower the pressures in pressure sectors 195 and 197, while a pressurized fluid is supplied to pressure sector 196 to increase the pressure in pressure sector 196.

Figure 6:
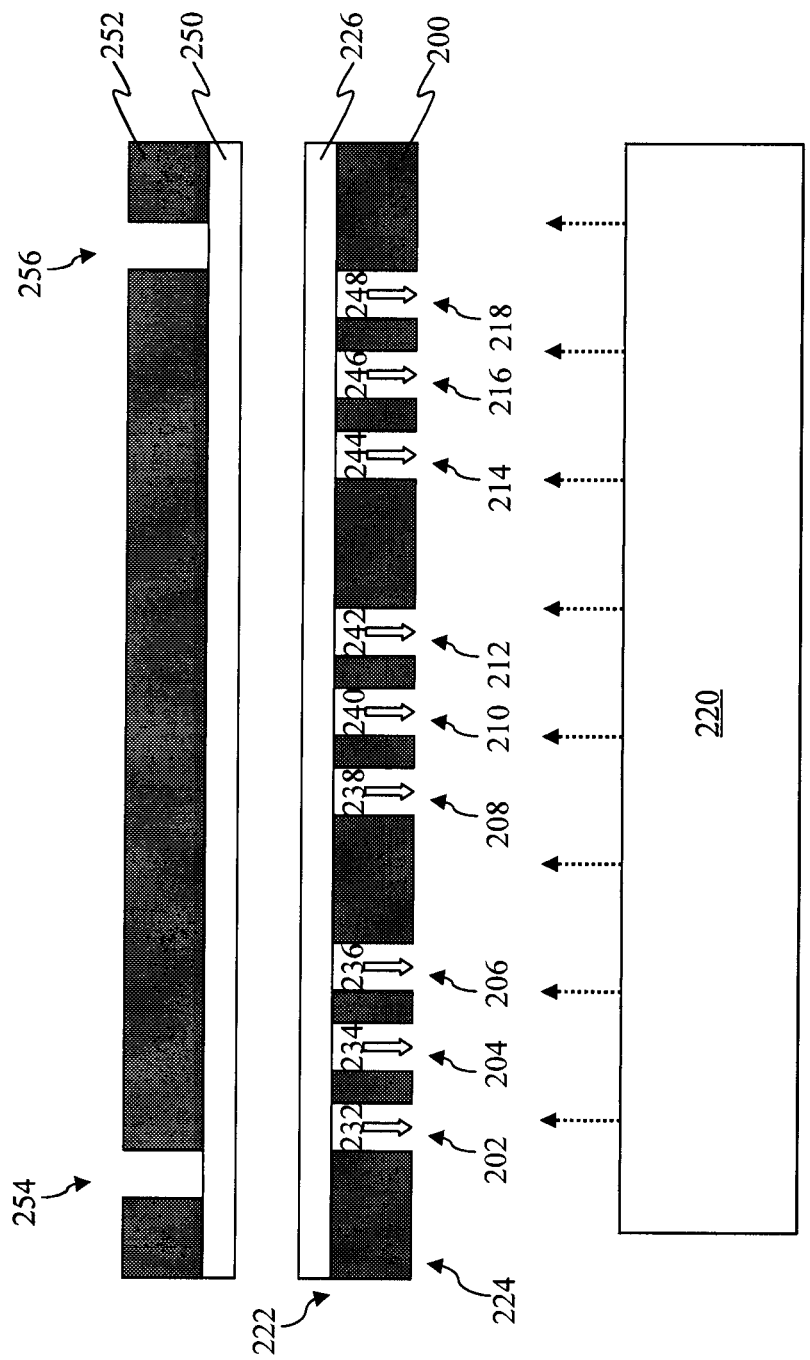
FIGS. 6-9 are high level diagrammatic side views of fabricating a semiconductor device according to various aspects of the present disclosure.

FIGS. 6-9 illustrate diagrammatic high level side views of fabricating a semiconductor device in different stages in accordance with an embodiment of the present disclosure. Referring now to FIG. 6, a wafer chuck 200 having holes 202, 204, 206, 208, 210, 212, 214, 216, and 218 is provided. Hole 210 is located near a center region of the wafer chuck 200. Holes 208, 206, 204, and 202 extend radially outward away from the hole 210 in one direction along the wafer chuck 200. Holes 212, 214, 216, and 218 extend radially outward away from the hole 210 in an opposite direction. The wafer chuck 200 is coupled to a pressure control structure 220 similar to the pressure control structure 165 described in FIG. 2 above. For the sake of simplicity, the components of the pressure control structure 220 are not shown in FIG. 5, and the coupling between the wafer chuck 200 and the pressure control structure 220 is represented by dashed lines extending outward of the pressure control structure 220. The wafer chuck 200 has a top side 222 and a bottom side 224. A semiconductor wafer 226 is positioned over the top side 222 of the wafer chuck 200. The semiconductor wafer 226 in the present embodiment includes radiation sensing devices, such as pixels, for sensing radiation projected thereon. In other embodiments, the semiconductor wafer 226 may include other suitable devices.

Fluids 232, 234, 236, 238, 240, 242, 244, 246, and 248 are present in the holes 202, 204, 206, 208, 210, 212, 214, 216, and 218, respectively. The fluids 232-248 include air in the present embodiment. In alternative embodiments, the fluids 232-248 may include other suitable gases or liquids, and may be different from one another. Referring back to FIG. 6, the pressure control structure 220 is used to force the fluids 232-248 to flow out of their respective holes 202-218 from the bottom side 224 of the wafer chuck 200. The flowing of the fluids 232-248 lowers an ambient pressure inside their respective holes 202-218 (refer to discussions of FIG. 2 above). Thus, a vacuum is created inside the holes 202-218, so that the semiconductor wafer 226 is securely positioned on the wafer chuck 200. In a similarly fashion, another semiconductor wafer 250 is secured to a wafer chuck 252 having holes 254 and 256 that are each located on an edge region of the wafer chuck 252. The semiconductor wafer 250 is located above and aligned with the semiconductor wafer 226. The wafer chuck 252 is coupled to a pressure control structure 220A similar to the pressure control structure 165 described in FIG. 2 above. For the sake of simplicity, the components of the pressure control structure 220A are not shown in FIG. 5, and the coupling between the wafer chuck 252 and the pressure control structure 220A is represented by dashed lines extending outward of the pressure control structure 220A.

Figure 7:
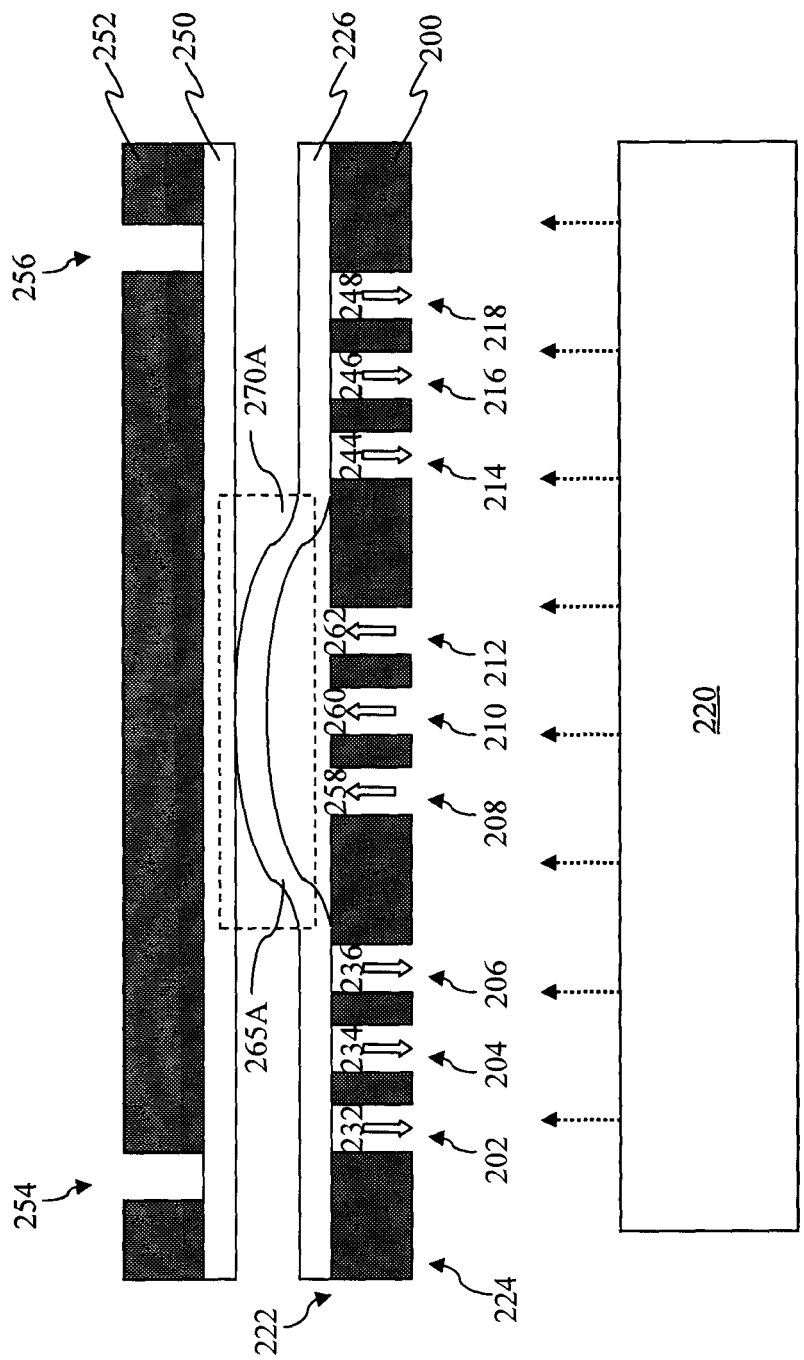

Referring now to FIG. 7, fluids 258, 260, and 262 are forced to flow into the holes 208, 210, and 212, respectively, using the pressure control structure 220. The fluids 258, 260, and 262 include air in the present embodiment but may include other suitable gases or liquids and may be different from one another in other embodiments. Flowing fluids 258, 260, and 262 into the holes 208, 210, and 212, respectively, increases the pressure inside the holes 208, 210, and 212. In part due to the increase of pressure in the holes 208-212, a portion 265A of the semiconductor wafer 226 overlying the holes 208, 210, and 212 bends upward, or forms an upward curvature, so that the portion 265A of the wafer 226 comes into contact with the semiconductor wafer 250. In other words, the semiconductor wafer 226 begins bonding with the semiconductor wafer 250. A region around the portion 265A is referred to as an activation zone 270A, the approximate boundaries of which are denoted by dashed lines shown in FIG. 7. Meanwhile, the semiconductor wafer 226 remains secured by the vacuum created in the holes 202-206 and 214-218 through flowing the fluids 232-236 and 244-248 out of the respective holes 202-206 and 214-218 from the bottom side 224 of the wafer chuck 200.

Figure 8:
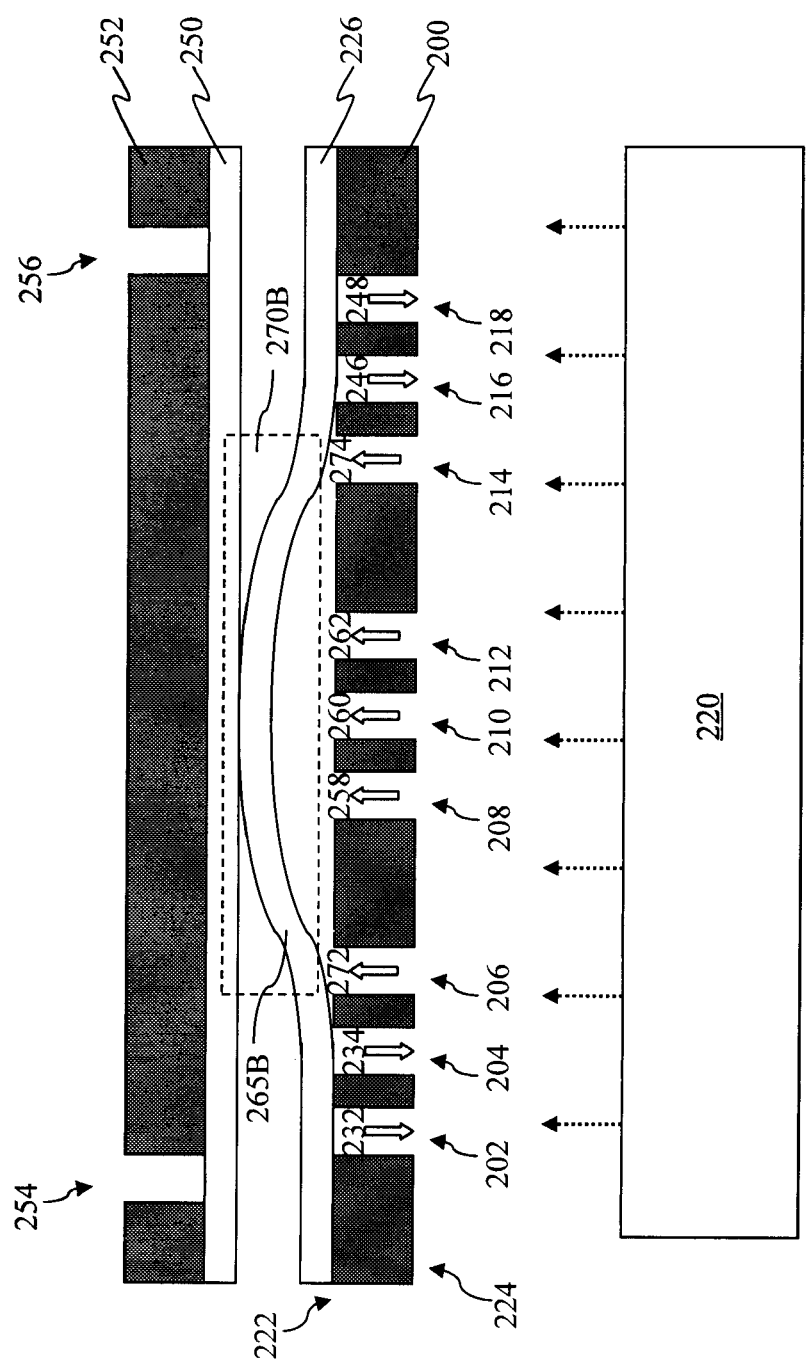

Referring now to FIG. 8, fluids 272 and 274 are forced to flow into the holes 206 and 214, respectively, using the pressure control structure 220. The fluids 272 and 274 include air in the present embodiment but may include other suitable gases or liquids and may be different from each other in other embodiments. Flowing fluids 272 and 274 into the holes 206 and 214, respectively, increases the pressure inside the holes 206 and 214. In part due to the increase of pressure in the holes 206 and 214, the curved portion 265A extends or expands to become the curved portions 265B. Consequently, the activation zone 270A expands into 270B. Meanwhile, the semiconductor wafer 226 remains secured by the vacuum created in the holes 202-204 and 216-218 through flowing the fluids 232-234 and 246-248 out of the respective holes 202-204 and 216-218 from the bottom side 224 of the wafer chuck 200. Thus, the bonding between the semiconductor wafer 226 and the semiconductor wafer 250 starts from a center region of the semiconductor wafers 226 and 250 and spreads to edge regions of the semiconductor wafers 226 and 250 in a radial and wave-like fashion. Hence, the bonding method of the present embodiment may be referred to as wave-bonding. In comparison with current methods, wave-bonding reduces the number of bubbles that may be trapped between the two semiconductor wafers 226 and 250 during bonding.

Figure 9:
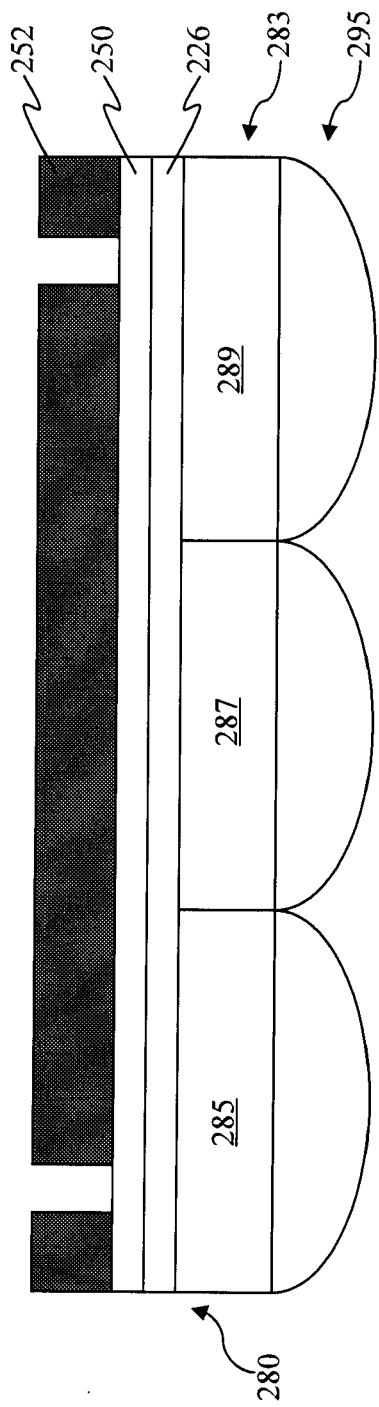

Referring now to FIG. 9, bonding between the two semiconductor wafers 250 and 226 is complete. The semiconductor wafer 226 is then thinned from a back side 280 (or bottom side) to reduce its thickness. Thereafter, a color filter layer 283 is formed over the back side 280 of the semiconductor wafer 226. The color filter layer 283 can support different color filters (e.g., red, green, and blue), and may be positioned such that the incident light radiation is directed thereon and there through. For example, the color filter layer includes a color filter 285 for filtering light radiation of a first wavelength, a color filter 287 for filtering light radiation of a second wavelength, and a color filter 289 for filtering light radiation of a third wavelength, so that light having different colors corresponding to the first, second, and third wavelengths are filtered by the color filters 285, 287 and 289, respectively. The color filters 285, 287, and 289 may include a dye-based (or pigment based) polymer or resin for filtering a specific wavelength band.

Thereafter, a micro-lens layer 295 having a plurality of micro-lenses is then formed over the color filters 285, 287, and 289 for directing and focusing light radiation towards pixels in the semiconductor wafer 226. The lenses in the micro-lens layer 295 may be positioned in various arrangements and have various shapes depending on a refractive index of material used for the micro-lens and distance from a sensor surface. It is understood that the semiconductor wafer 226 may also undergo an optional laser annealing process before the forming of the color filter layer 283 or the micro-lens layer 295. Also, an anti-reflective-coating (ARC) layer may be optionally formed between the semiconductor wafer 226 and the color filter layer 283.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus, comprising:
   a non-conductive wafer chuck having first and second holes that extend therethrough, the wafer chuck being configured to hold a wafer; and
   a pressure control structure that can independently and selectively vary a fluid pressure in each of the first and second holes in a manner such that one of the first and second holes has a pressure below an ambient pressure while the other one of the first and second holes has a pressure above the ambient pressure, wherein the pressure control structure includes:
      controller that is configured to selectively open and close each of the valves;
      a vacuum source that is directly connected to each of the first and second holes through respective valves; and
      a pressure source that is directly connected to each of the first and second holes through respective valves;
   wherein the second hole is located closer to a center of the wafer chuck than the first hole, and wherein the pressure control structure is configured to facilitate a wave-bonding of the wafer with an external wafer by:
      creating a vacuum in the first and second holes at a first point in time;
      supplying a pressurized fluid to the second hole while maintaining the vacuum in the first hole at a second point in time after the first point in time in a manner such that a first portion of the wafer disposed above the second hole is bent above and away from the wafer chuck; and
      supplying the pressurized fluid to the first and second holes at a third point in time after the second point in time in a manner such that a second portion of the wafer disposed above the first and second holes is bent above and away from the wafer chuck.

2. The apparatus of claim 1, wherein the valves include first, second, third, and fourth valves, each of the valves having a first end portion and a second end portion;
   and further including: a first passageway having first, second, and third ports, and a second passageway having fourth, fifth, and sixth ports, the first and second ports being coupled to the first end portions of the first and third valves, respectively, and the fourth and fifth ports being coupled to the first end portions of the second and fourth valves, respectively, and the third and sixth ports being coupled to the first and second holes, respectively;
   wherein the vacuum source is coupled to the second end portions of the first and second valves, and the pressure source is coupled to the second end portions of the third and fourth valves.

3. The apparatus of claim 1, wherein the wafer chuck is a first wafer chuck, and further including a second wafer chuck that is approximately aligned with the first wafer chuck, wherein the first and second wafer chucks are configured to be used to bond two wafers together.

4. The apparatus of claim 1, wherein the wafer chuck includes a first groove and a second groove, the first hole being located on a portion of the first groove, and the second hole being located on a portion of the second groove;
   wherein the wafer chuck includes flat top and bottom surfaces, such that a thickness of the wafer chuck varies in a range from about 0.1 um to about 100 um.

5. The apparatus of claim 1, wherein the ambient pressure is an atmospheric pressure.

6. The apparatus of claim 1, wherein the first hole and the second hole are individually segregated from each other.

7. The apparatus of claim 1, wherein the second portion of the wafer is inclusive of, and greater than, the first portion of the wafer.

8. The apparatus of claim 1, wherein the vacuum is at a pressure that is about 940 milli-bars less than the ambient pressure, and the pressurized fluid is at a pressure that is about 940 milli-bars greater than the ambient pressure.

9. An apparatus, comprising:
a first wafer-holding device that includes:
a top side and a bottom side; and
a plurality of openings that each extend through the first wafer-holding device from the top side to the bottom side, wherein the openings are free of being in fluid communication with one another;
a second wafer-holding device that is located over the top side of the first wafer-holding device, the first and second wafer-holding devices being configured to hold first and second wafers, respectively; and
a control structure that is configured to individually control a pressure in each of the openings of the first wafer-holding device, the control structure including a vacuum source, a pressure source, and a controller that is coupled to the vacuum source and the pressure source, the controller being configured to selectively open and close each of the openings to control fluid flow between each of the openings and the vacuum source or the pressure source;
wherein the vacuum source, the pressure source, and the controller are each coupled to each of the openings and are collectively configured to cause the first wafer to be bonded to the second wafer by selectively increasing or decreasing pressure in the plurality of openings in a manner such that a bonding between the first and second wafers starts from a center region of the first and second wafers and spreads to edge regions of the first and second wafers in a radial and wave-like fashion.

10. The apparatus of claim 9, wherein:
the vacuum source is coupled to each of the openings through a plurality of first passageways and first valves;
the pressure source is coupled to each of the openings through a plurality of second passageways and second valves; and
the controller is configured to: supply a vacuum or a pressure to each of the openings by selectively opening and closing the first and second valves.

11. The apparatus of claim 9, wherein:
the vacuum source includes a vacuum pump configured to suck a fluid toward the vacuum source;
the pressure source includes a pressure pump configured to propel a fluid away from the pressure source; and
the first wafer-holding device includes a dielectric wafer chuck.

12. The apparatus of claim 9, wherein the first wafer-holding device includes a plurality of portions having different pressures therein, each of the portions being coupled to at least one of the openings.

13. The apparatus of claim 12, wherein:
the portions each include a pressure zone that contains a plurality of interconnected grooves;
at least one of the grooves has one of the openings disposed thereon; and
at least one of the portions is surrounded by another one of the portions.

14. The apparatus of claim 12, wherein:
the portions each include a pressure sector that contains an arc-shaped groove;
each of the sectors is surrounded by a plurality of walls; and
at least one of the walls has one of the openings disposed thereon.

15. The apparatus of claim 9, wherein the control structure is configured to:
supply pressure to openings aligned with the center region of the first and second wafers to cause the bonding between the first and second wafers in the center region; and
supply pressure to openings aligned with the edge region of the first and second wafers to cause a bonding between the first and second wafers in the edge region.

16. The apparatus of claim 9, wherein the pressure is about 940 milli-bars greater than a standard atmospheric pressure.

17. An apparatus, comprising:
a device that is configured to hold a wafer, the device having opposite first and second surfaces and first and second openings that each extend from the first surface to the second surface, wherein the wafer is located on the first surface of the device, wherein the first opening is disposed farther away from a center region of the device than the second opening, and wherein the first opening is free of being in fluid communication with the second opening; and
a pressure control structure coupled to the device, the pressure control structure being configured to facilitate a wave-bonding of the wafer with an external wafer by:
at a first point in time, creating a pressure less than a standard atmospheric pressure in the first and second openings;
at a second point in time after the first point in time, creating a pressure greater than the standard atmospheric pressure in the second opening while maintaining the pressure less than the standard atmospheric pressure in the first opening in a manner such that a first portion of the wafer disposed over the second opening is bent away from the device configured to hold the wafer; and
at a third point in time after the second point in time, creating the pressure greater than the standard atmospheric pressure in the first and second openings in a manner such that a second portion of the wafer disposed over the first and second openings is bent away from the device configured to hold the wafer.

18. The apparatus of claim 17, wherein the pressure control structure further includes:
first, second, third, and fourth conduits for fluid flow, the first and second conduits being coupled to the first opening, and the third and fourth conduits being coupled to the second opening;
a first pump coupled to the first and second openings through the first and third conduits, respectively, the first pump being configured to create a partial vacuum within the first and third conduits;
a second pump coupled to the first and second openings through the second and fourth conduits, respectively, the second pump being configured to deliver a pressurized fluid to the second and fourth conduits; and
a control unit that is coupled to the first, second, third, and fourth conduits, the control unit being configured to selectively open and shut off each of the first, second, third, and fourth conduits.

19. The apparatus of claim 17, wherein the second portion of the wafer is inclusive of, and greater than, the first portion of the wafer.

20. The apparatus of claim 17, wherein the pressure greater than the atmospheric pressure is about 940 milli-bars greater than the standard atmospheric pressure, and wherein the pressure less than the atmospheric pressure is about 940 milli-bars less than the standard atmospheric pressure.

* * * * *